United States Patent
Matsumoto (10) Patent No.: US 7,446,045 B2
(45) Date of Patent: Nov. 4, 2008

(54) METHOD OF MANUFACTURING NITRIDE SUBSTRATE FOR SEMICONDUCTORS

(75) Inventor: Naoki Matsumoto, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 24 days.

(21) Appl. No.: 11/692,938

(22) Filed: Mar. 29, 2007

(65) Prior Publication Data

US 2007/0167021 A1    Jul. 19, 2007

Related U.S. Application Data

(63) Continuation of application No. 10/904,213, filed on Oct. 29, 2004, now Pat. No. 7,229,926.

(30) Foreign Application Priority Data

Oct. 30, 2003    (JP)    ............... 2003-370430

(51) Int. Cl.
   *H01L 21/302*    (2006.01)
(52) U.S. Cl. ............... 438/691; 438/697; 438/704; 438/734; 257/E21.303; 257/E21.304
(58) Field of Classification Search ............... 438/691, 438/697, 704, 734; 257/E21.303, E21.304
   See application file for complete search history.

(56) References Cited

FOREIGN PATENT DOCUMENTS

| CN | 1426497 A | 6/2003 |
|---|---|---|
| JP | H08-321445 A | 12/1996 |
| JP | 2000-084807 A | 3/2000 |

*Primary Examiner*—Thanh V Pham
(74) *Attorney, Agent, or Firm*—James W. Judge (57) ABSTRACT

In an independent GaN film manufactured by creating a GaN layer on a base heterosubstrate using vapor-phase deposition and then removing the base substrate, owing to layer-base discrepancy in thermal expansion coefficient and lattice constant, warp will be a large ±40 μm to ±100 μm. Since with that warp device fabrication by photolithography is challenging, reducing the warp to +30 μm to −20 μm is the goal. The surface deflected concavely is ground to impart to it a damaged layer that has a stretching effect, making the surface become convex. The damaged layer on the surface having become convex is removed by etching, which curtails the warp. Alternatively, the convex surface on the side opposite the surface having become convex is ground to generate a damaged layer. With the concave surface having become convex due to the damaged layer, suitably etching off the damaged layer curtails the warp.

8 Claims, 3 Drawing Sheets

Definition of warp amplitude, orientation

FIG. 1

Definition of warp amplitude, orientation

FIG. 2

Post-grinding relationship between damaged layer and surface roughness

○ Damaged layer depth
● Ra

FIG. 3

Relationship between wet etching depth and warp

FIG. 4

Post-grinding relationship between front-side etching depth and warp

Warp control methods

FIG. 5A

When warped in
the positive
direction

↓

Warp amplitude lessened
by introducing damaged
layer into back side

Damaged layer

FIG. 5B

When warped
in the negative
direction

↓

Warp amplitude lessened
by introducing damaged
layer into front side

Damaged layer

FIG. 5C

Damaged layer

↓

Warp amplitude lessened
by thinning damaged
layer into back side

Damaged layer

METHOD OF MANUFACTURING NITRIDE SUBSTRATE FOR SEMICONDUCTORS

BACKGROUND OF THE INVENTION

1. Technical Field

The present invention relates to methods of manufacturing reduced-warp nitride substrates for semiconductors, and to nitride semiconductor substrates manufactured by the method.

2. Description of the Related Art

Substrates on which semiconductor devices are fabricated are round wafers, and given that the devices are fabricated on the front surface of the substrates by such methods as photolithography, doping, diffusion, and vapor deposition including chemical vapor deposition (CVD), the front surface must be flat, with minimal warp. When fabricating semiconductor devices onto silicon and onto gallium arsenide in particular as substrates, Si and GaAs wafers with minimal warp, polished to an optically smooth, mirror finish are employed.

Sapphire wafers are used as the substrates for blue light emitting diodes in which indium gallium nitride is the light-emitting layer. InGaN/GaN-based LEDs formed onto sapphire substrates have performed well and are dependable. The sufficiently moderate cost of sapphire substrates has meant that InGaN-based LEDs can be made at low-cost.

Nevertheless, there are drawbacks to sapphire. For one, with sapphire being an insulator, rather than attaching n electrodes to the bottom, a GaN layer onto the surface of which the n electrodes are attached is applied, thus requiring excess area. Another is that since sapphire does not cleave, it cannot be rent into chips along natural cleavages. And because it is GaN and InGaN that are grown onto the heterosubstrate there is misfit, which leads to heavy defects.

Under the circumstances, then, it is desirable that GaN itself be the substrate. GaN substrates have become producible by depositing a thick GaN film onto a heterosubstrate base using vapor-phase deposition and removing the base to create a GaN freestanding layer. And in terms of size, 50-mm diameter Substrates—long-awaited—have also become possible.

Vapor-phase grown GaN-crystal wafers are, however, used as-grown for epitaxial deposition substrates. In the front side of GaN substrates that have been vapor-phase deposited and nothing more roughness is considerable and warp is serious; growing GaN and InGaN onto such substrates will not necessarily lead to a lowering of defects over the situation with sapphire substrates. And LEDs created experimentally on as-grown GaN substrates certainly do not perform better than LEDs manufactured on sapphire.

Because the formation of semiconductor devices onto GaN substrates is by photolithography, flat, mirror-finish wafers with minimal warp are desired as the substrates. Polishing and etching technology is necessary to render the surface of a wafer optically smooth. Polishing and etching technologies have already been established for fully developed semiconductor substrates such as Si and GaAs. Si and GaAs crystal can be grown by gradually solidifying a melt, as in the Czochralski method or the Bridgeman method. Since long, columnar ingots with few dislocations can be produced by growing from the liquid phase, the ingots are sliced with an internal-diameter saw to produce wafers. This means that warp is minimal from the start.

With GaN on the other hand, growth, being impossible from the liquid phase, is by means of vapor-phase deposition. Furthermore, what form optimal polishing and etching methods should take is still not understood. If GaN is to be hetero- deposited onto crystal of a different kind, such as has three-fold symmetry, the growth will necessarily be c-axis oriented. The surfaces are a (0001) plane and a (000$\bar{1}$) plane. Because GaN crystal does not have reverse symmetry, the (0001) and (000$\bar{1}$) planes are not crystallographically equivalent. The (0001) face is one in which gallium atoms range in lines globally over the episurface, and the (000$\bar{1}$) face is one in which nitrogen atoms range in lines globally over the episurface.

The former can be referred to as the (0001) Ga face, or simply the Ga face; the latter, as the (000$\bar{1}$) N face, or simply the N face. Physiochemically the Ga face is extremely unyielding and rugged, and is not dissolved by chemical agents. The N face is also physiochemically robust, but is corroded by certain types of strong acids and alkalis. GaN crystal has such asymmetry.

When GaN is grown onto a base substrate, the front side and back side become either the Ga face or the N face. Depending on how the base substrate is selected, the front side can be made the Ga face or the N face. The back side then becomes the face with the opposite polarity.

For the sake of simplicity, a case in which the front side is the (0001) Ga face, and the back side is the (000$\bar{1}$) N face will be considered. The same statements can be made, and the same design features implemented in the opposite situation as well.

Since the subject of the present invention is warp, to begin with a definition of warp will be given. Warp can be expressed as radius of curvature, or curvature. These are exact expressions and can be given locally. Even in situations in which the warp is complex and the substrate has heavy roughness, exact warp can be expressed using a local curvature expression. For example, warp with a saddle point and cylindrical-lens-like warp can also be expressed.

But with uniform buckling in round wafers, warp is often represented by a simpler expression. If the roughness is uniform the wafer is measured taking the height H to the planar face from the surface of the center area in the convexity, according to which a value for the warp is given. This is intuitive, and facilitates measurement. The absolute value is determined by this warp measurement.

Figure 1:
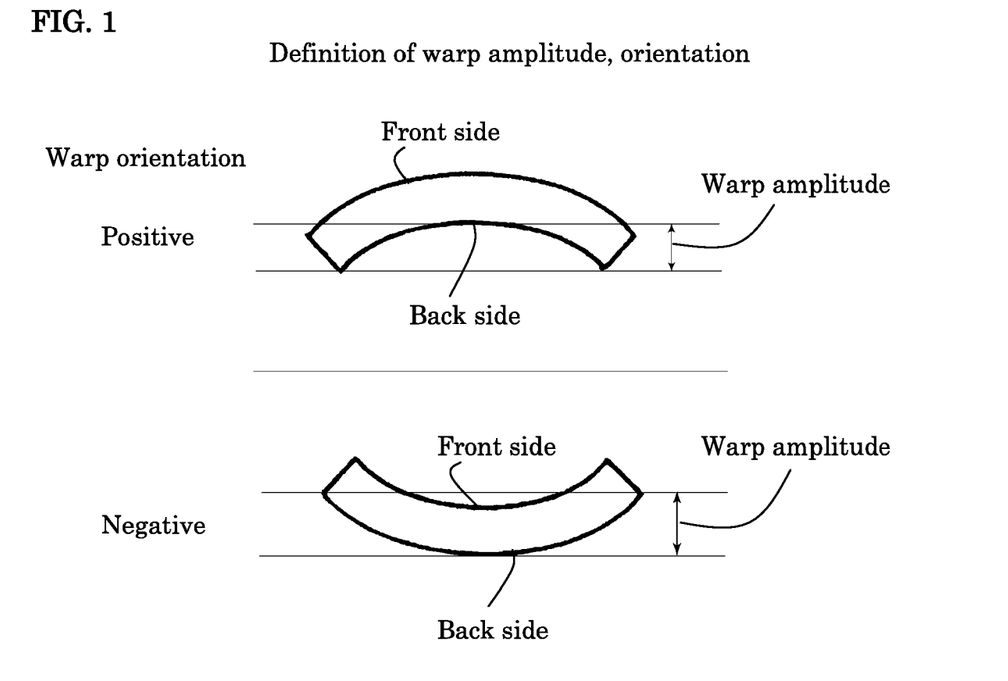
FIG. 1 is exaggerated, outline sectional views of a substrate, representing definitions of the sign given to warp, in which convex warp along the front side is positive, and convex warp along the backside is negative.

The sign of the warp will be given by its orientation. This definition is indicated in FIG. 1. Warp curving outward along the front side will be termed positive (H>0); warp curving inward along the front side will be termed negative (H<0).

In situations in which long monocrystal ingots with few dislocations can be produced—such as is the case with Si and GaAs—since the ingots are sliced with an internal-diameter saw or a wire saw, warp is slight from the start. To produce GaN crystal, however, with growth from the liquid phase being impossible, vapor-phase growth is carried out. Because rendering GaN crystal is by heteroepitaxy onto a heterosubstrate that differs from GaN in thermal expansion coefficient, and then removal of the heterosubstrate, considerable warp appears in GaN crystal. This problem is due not only to the difference in thermal expansion coefficient, but also to the many dislocations that come about because the base substrate and the overlying film are different materials. The dislocations give rise to irregular stresses, which due to the volume of dislocations is why warp comes about.

As-grown, platelike, 20-50 mm diameter GaN crystal from which the base substrate has been removed has a warp of from ±40 μm to as much as ±100 μm, although the value will differ depending on the type and crystal-plane orientation of the base substrate, and on the vapor-phase deposition parameters.

With the warp in a GaN wafer substrate being that extensive, in a situation in which a photolithographic resist on the wafer is to be exposed its dimensions will be thrown out of balance. Thus the warp must be extensively reduced. Warp in Si and GaAs wafers also has to be lessened, but with GaN there is a special reason why warp has to be reduced. Since GaN is transparent, when the wafer is set on a susceptor with a built-in heater and heated, not much of radiant heat from the heater heating the GaN crystal occurs. Seeing as how thermal conduction from the susceptor is the principal heat-transmission means, the back side of the GaN crystal desirably is flat, with its entire surface in contact with the susceptor without gaps.

Instances of the above outward-curving (positive warp, H>0) mean that the wafer center portion comes apart from the susceptor. Such cases are still the better, because the thermal conduction is from the peripheral margin heading toward the center. Oppositely, in instances of the above inward-curving (negative warp, H<0), with only the center contacting susceptor the wafer ends up turning, leading to positional instability. Not only that, but source-material gases circle to the back side through the encompassing, lifted-up area, causing thin-film growth or etching to occur on the backside of the substrate also. Consequently, negative warp is even less suited to semiconductor fabrication needs than positive warp.

Because as-grown GaN crystal has a warp H of from ±40 μm to ±100 μm, the number one objective is to decrease the warp to be within a +30 μm to −20 μm range.

More advantageously, the warp should be decreased to within a +20 μm to −10 μm range.

Furthermore, if possible, bringing the warp to within +10 μm to −5 μm would even better meet fabrication needs.

There are any number of examples of devising a crystal growth method to minimize warp in the products. These may be grossly bifurcated into those that reduce warp by lateral overgrowth of the GaN to alleviate vertically oriented stress and reduce internal stress, and those that grow two layers having competing actions and eliminate warp by the balance between the actions. Every one of these is a way of attempting to reduce, via the deposition parameters, warp in crystal being grown; they are not ways of attempting to reduce warp in crystal already produced.

Japanese Unexamined Pat. App. Pub. No. H11-186178 addresses the problem of incidents of warp and cracking in GaN crystal that due to the difference in the coefficients of thermal expansion of Si and GaN occur when a GaN film is grown onto an Si substrate to create a GaN/Si composite substrate.

This reference relates that to prevent warp and cracking from occurring in GaN crystal, stripes of $SiO_2$ film are formed onto an Si substrate, and when GaN film is grown onto the substrate, atop the $SiO_2$ growth of GaN does not initially occur, thereby alleviating stress and reducing warp in the GaN/Si composite substrate. This substrate is not an independent film of GaN, but rather a composite substrate in which a thin GaN layer on the order of 10 μm is provided on an Si base, so that internal stress in the GaN layer can be reduced by having the $SiO_2$ intervene.

Japanese Unexamined Pat. App. Pub. No. 2002-208757 concerns manufacturing nitride semiconductor substrates of satisfactory crystallinity, by employing lateral overgrowth and, to keep warp under control, dispersing throughout the substrate overall the coalescence boundaries, where defects concentrate.

Japanese Unexamined Pat. App. Pub. No. 2002-335049 proposes a deposition method that by reducing dislocations by means of lateral overgrowth to diminish stress, also reduces warp.

Japanese Unexamined Pat. App. Pub. No. 2002-270528 proposes a deposition method in which reducing dislocations by means of lateral overgrowth to reduce stress keeps warp from occurring.

Japanese Unexamined Pat. App. Pub. No. 2002-228798 exploits Si crystal not as a semiconductor but as a mirror. The goal is to create concave or convex mirror surfaces from Si crystal. To get Si crystal to possess a desired curvature, it must be deformed. To do so, a thin film of diamond is built up on an Si substrate, and the Si substrate is deformed by the stress between the diamond thin film/Si substrate. In other words, the original planar article is forcibly buckled to lend it a concave or convex mirror surface. The reference states that Si can be buckled into a curvature of choice depending on the diamond formation parameters.

Japanese Unexamined Pat. App. Pub. No.2003-179022 addresses the problem that after forming semiconductor devices onto a large-caliber Si wafer, the wafer is back-side ground and the back side is mechanically planed to reduce the wafer to a desired thickness, but a processing distortion layer is formed, producing a warp of 800 μm, and etching away the layer takes too much time. This reference states that, given the realization that the processing distortion layer on the Si wafer back side is amorphous, warp is eliminated by exposing the Si back side for 5 seconds with light from a halogen lamp to momentarily heat the wafer to 600-700° C. and convert the processing distortion layer from an amorphous to a crystalline state. Thus this is an example not of ridding the wafer of the processing distortion layer, but eliminating warp in the wafer by qualitatively transforming the layer.

Inasmuch as nitride semiconductor is chiefly produced using vapor-phase deposition to build up a thin film onto a heterosubstrate and removing the base substrate, with dislocations due to the difference in thermal expansion coefficients and the mismatching lattice constants occurring at a high density, warp is serious. Although methodologies for diminishing warp by devising growth methods to diminish internal stress have been variously proposed, they are yet insufficient.

Even with such methodologies, manufacturing nitride semiconductor crystal of large film thickness and large diameter means the dislocations and warp will be considerable, and when the base substrate is removed the crystal often ends up cracking. Even if the crystal does not crack, the warp will be large, reaching ±40 μm to as much as ±100 μm.

BRIEF SUMMARY OF THE INVENTION

Objects of the present invention are in such crystal substrates in which warp is large to reduce the warp by means of a post-deposition process.

A first object is bringing out a processing method so that the warp figure for nitride semiconductor substrate as 2-inch wafers is brought to within a range of +30 μm to −20 μm. A second object is bringing out a processing method that brings the warp figure for GaN substrates to within +20 μm to −10 μm. A third object of the present invention is making available a processing method in which, the warp figure for nitride semiconductor substrates is reduced to within +10 μm to −5 μm by means of a post-deposition process. A fourth object of the present invention is bringing out nitride semiconductor substrates in which the warp is within +30 μm to −20 μm.

A method of manufacturing nitride semiconductor substrates according to one aspect of the present invention addresses warp in a nitride semiconductor substrate by mechanically grinding, to introduce a damaged layer into, the concave face of the buckled substrate, thereby extending the concave face, bringing it close to being planar and reducing the warp.

In accordance with a nitride substrate manufacturing method in another aspect of the invention, by mechanically grinding, to introduce a damaged layer into, the concave face of a nitride semiconductor substrate in which there is warp, the concave face is extended to deform it convexly; and by etching the convexly deformed surface to remove the damaged layer partially or entirely and bring down the convex face, the substrate is brought close to being planar, which reduces the substrate warp.

According to a manufacturing method in a further aspect of the invention, by mechanically grinding, to introduce a damaged layer into, the concave face of a nitride semiconductor substrate in which there is warp, the concave face is extended to deform it convexly; the convexly deformed surface is etched to remove the damaged layer partially or entirely and bring down the convex face; and by mechanically grinding, to introduce a damaged layer into, the surface that has turned into a concave face on the opposite side, the concave face is extended, rendering it a convex face; by etching the surface that has now been convexly deformed and bringing down that convex face, the substrate is brought close to being planar, which reduces the substrate warp.

A further aspect of the invention is a manufacturing method according to which, by mechanically grinding, to introduce a damaged layer into, the concave face of a nitride semiconductor substrate in which there is warp, the concave face is extended to deform it convexly; and by mechanically grinding, to introduce a damaged layer into, the surface that has turned into a concave face on the opposite side, the concave face is extended, rendering it a convex face; by etching the surface that has now been convexly deformed and bringing down that convex face, the substrate is brought close to being planar, which reduces the substrate warp.

From the following detailed description in conjunction with the accompanying drawings, the foregoing and other objects, features, aspects and advantages of the present invention will become readily apparent to those skilled in the art.

BRIEF DESCRIPTION OF THE SEVERAL VIEWS OF THE DRAWINGS

FIG. 3 is a graph plotting measured values of warp H against those of etching depth when a damaged layer on the back side (N face) of a post-back-side-ground GaN wafer was wet-etched utilizing a KOH solvent. The horizontal axis is the etching depth (μm), and the vertical axis is the wafer warp H (μm). From the graph it is evident that etching a wafer with an initial −33 μm concave warp (curving inward along the front side) proceeded to decrease the warp. When some 5 μm had been etched, the warp became a constant −10 μm or so, not decreasing to less than that.

FIG. 4 is a graph plotting measured values of warp H against those of etching depth when a damaged layer on the front side (Ga face) of a GaN wafer after having been ground utilizing a chlorine plasma was dry-etched. The horizontal axis is the front-side etching depth (μm), and the vertical axis is the wafer warp H (μm). From the graph it is evident that etching a wafer with an initial +41 μm convex warp (curving outward along the front side) proceeded to decrease the warp. When some 6 μm had been etched, the warp became a constant +10 μm or so, not decreasing to less than that.

FIG. 5 is crystal-section views for explaining fundamental techniques of the present invention for reducing warp in wafers by combining formation of a damaged layer by grinding, and reduction of the damaged layer by etching. The upright lines represent dislocations, and the speckles represent damaged layers.

DETAILED DESCRIPTION OF THE INVENTION

From stages in manufacturing a GaN substrate to grinding and etching in the present invention will be explained in more detail.

1. Growing GaN Ingots

GaN freestanding layers are created according to the method set forth in Japanese Unexamined Pat. App. Pub. Nos. 2000-12900 and 2000-22212. An epitaxial lateral overgrowth (ELO) mask is laid onto a (111) GaAs wafer, and the GaN is grown by a vapor-phase epitaxy technique such as hydride or metalorganic-chloride vapor phase epitaxy (HVPE or MO-chloride VPE).

The GaN is grown on the ELO mask to reduce stress in the crystal, and moreover is subjected to facet growth to reduce dislocations. The deposition yields GaN of 100 μm to several mm in thickness, and the GaAs substrate is removed to give an independent GaN substrate.

Techniques for removing the GaAs base substrate include dissolving with aqua regia, shaving off by polishing, and delaminating by a lift-off process. GaN films grown thin render single, freestanding GaN wafers; when thick they are cut with a wafer saw to yield a plurality of wafers.

As-grown GaN crystal after the GaAs has been removed is often convex along the back side, and the warp amplitude H is often ±40 μm to as much as ±100 μm. The roughness ($R_{max}$) along the back side can be 10 μm or more. Such serious warp occurs owing to the large difference in thermal expansion coefficient between the base substrate and the GaN, and to the massive dislocations produced by their mismatching lattices. Occurrences of such warp are inevitable despite a mask-utilizing lateral overgrowth technique as just discussed being carried out.

To have the GaN substrates be as they should for manufacturing semiconductor devices onto them, the warp must be decreased, and the front and back sides planarized (lowering the degree of surface roughness). Henceforth a discussion of the present invention will develop.

2. Evaluating Damaged Layer in Ground Substrates

The post-grinding damaged layer on the substrates was evaluated by cross-sectional observation using scanning electron microscopy (SEM) and cathode luminescence (CL).

From the observation results, it was evident that on a substrate in which the GaN crystal face was ground employing #325 diamond grit, the depth of the damaged layer was approximately 4.8 µm.

The mesh (size) of the diamond grit correlates with the surface roughness. The rougher the grit is the rougher the surface ground with the grit will be. With finer grit texture, the face ground with the grit will turn out planar. In turn, since the damaged layer arises from grinding, the damaged layer ought to bear a relationship to the roughness of the grit. This means that by way of the roughness of the grit texture, there ought to be a correlation between the thickness of the damaged layer and the surface roughness.

Given these considerations, the relation between the depth of the damaged layer and the surface roughness was investigated. The results are shown in the FIG. 2 graph. The horizontal axis is the mesh (#). The larger the number, the finer the grit is. Plotted in the graph are damaged layers on GaN crystal planed with #80, #325 and #1000 grit, versus roughness. The vertical axis on the left indicates damaged layer depth (thickness in µm), while the vertical axis on the right indicates surface roughness Ra (µm).

Figure 2:
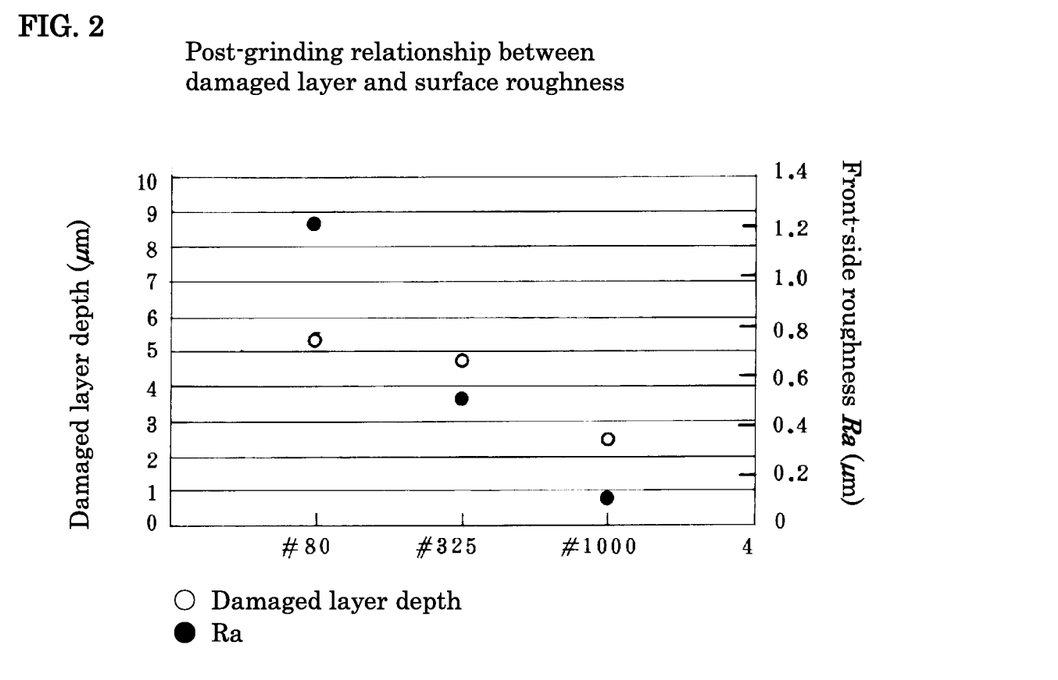
FIG. 2 is a graph plotting measurements of front-side roughness (Ra: μm) and damaged layer depth for when the front side of a 2-inch GaN wafer underwent a grinding operation with #80, #325, and #1000 diamond grit. The horizontal axis is the grit (mesh) number, the right vertical axis is the level of surface roughness Ra (μm), and the left vertical axis is damaged layer depth (μm). It is apparent from the graph that with the grit as the mediating agent, the deeper the damaged layer is, the larger the surface-roughness level becomes.

From the graph it will be understood that the lower the surface roughness, the thinner will be the damaged layer. The depth of the damaged layer is dependent on the grain size of the diamond grit employed. The significance of this is that the depth of the damaged layer can be controlled. Using a fine-textured grit diminishes the damaged layer and makes it smooth. By the same token, using a coarse-textured grit allows a thick damaged layer to be created deliberately.

Grinding with a grit of a suitable texture smoothes, and produces a damaged layer on, the GaN substrate face. The damaged layer acts to stretch the surface on which it is formed. If the action is excessive, the crystal will end up buckling oppositely. In order to rectify this, the damaged layer should be partially removed, and to do so etching was carried out. For the etch, both wet etching using chemical agents and dry etching using plasma were tried.

3. Study of Front-Side Wet Etching

After being processed, the surface of a GaN substrate underwent wet etching. KOH (aqueous solution, 8 N concentration) was heated to 80° C., and the GaN substrate was wet-etched by immersing it into the solution. The warp was not, however, altered. This means that a GaN crystal face on which a damaged layer has been produced by polishing is not wet-etched by KOH.

The (0001) faces of GaN have polarity. One face (the Ga face) is terminated with gallium atoms, and the other face (the N face) is terminated with nitrogen atoms. The Ga face is hard and unyielding, and is chemically stable. No chemical agent that can effectively etch a Ga face exists. Since the front side was the Ga face and the back side was the N face, when the substrate was dipped into the KOA solution the back-side N face was slightly etched but the front-side Ga face was not etched at all. Because the front side, being polished, had the damaged layer, KOH did not remove the front-side damage layer.

Wet-etching GaN with a strong alkali like heated KOH, or a strong acid such as $H_3PO_4$ has been documented. But such instances have amounted only to erosion of the N face. The GaN that the present invention inventors manufacture possesses a composite front side in which the N face and the Ga face appear in alternation. Since wet-etching the GaN in an etchant such as KOH or $H_3PO_4$ etches only the N face, creating pits, the front side ends up being ragged. Despite the pains taken to polish the front side, it ends up ruined, not amounting to anything. Ultimately, therefore, wet-etching of the front side (Ga face) proves to be impossible.

4. Back-Side Wet Etching

The back side (N face) of GaN substrates is ground. A damaged layer is created on the back side by polishing, and the substrates buckle convexly along the back side (warp: negative). It was discovered that when substrates having a negative warp are wet-etched with an 8 N KOH solution at 80° C. or with $H_3PO_4$ phosphoric acid, with elapsed etch time the absolute value of the warp decreases. That is, the back side—being the N face—is etched by a strong alkali and a strong acid, and by the very diminishment of the diminishing damaged layer, the warp is curtailed. This means that back-side polishing and wet etching form a method that can be utilized to curtail warp.

Figure 3:
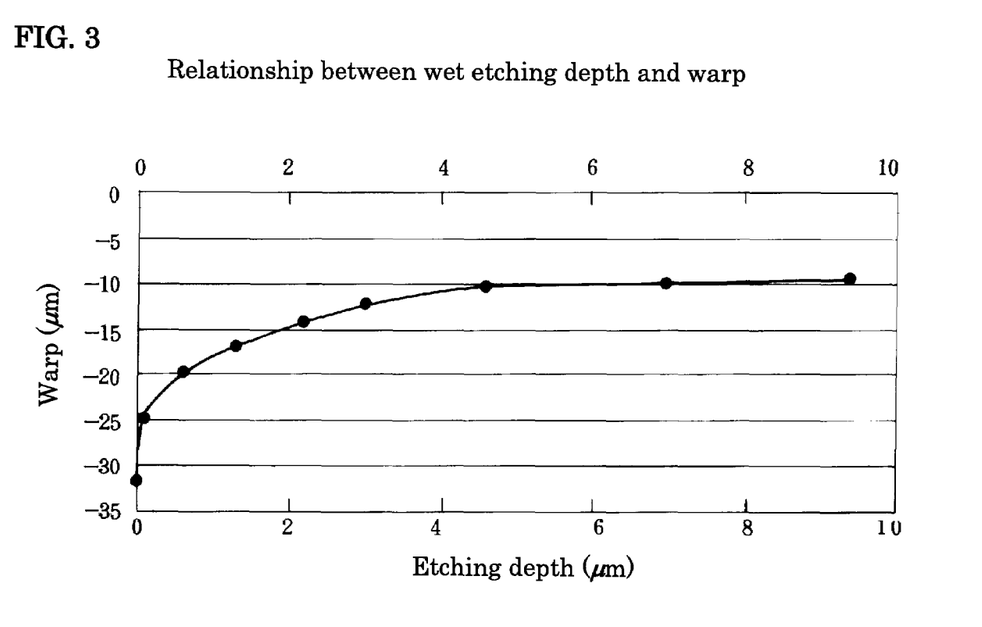

Results of thus utilizing the method are shown in FIG. 3. Under conditions for back-side wet etching identical to those just noted, the back side of a GaN substrate was wet-etched. The horizontal axis in the graph represents the wet-etching depth (µm), and the vertical axis, warp (µm). From the graph it is evident that wet-etching a concave GaN substrate whose front side possessed an initial −33 µm concave warp curtailed the warp. When some 5 µm had been etched, the warp went to around −10 µm; etching beyond that did not lead to diminishment of the −10 µm warp.

In addition, variation in the thickness was under several µm, which was at the non-problematic level.

Wet-etching the back side of the substrate gave the GaN crystal—whose front side, being globally mirror-finished, was transparent—a clouded appearance like frosted glass. This was because the back side had been surface-roughened. Since the warp was reduced, in situations in which it is acceptable for the back side to be glazy, the substrate can be used in that state.

There are situations, however, in which the back side being glazy would create Problems—in which the back side has to be a mirrorlike surface. In such cases, arrangements have to be made to remove the damaged layer by dry-etching the back side. When removal is by dry etching, the back side does not become frosted-glasslike.

The fact that wet-etching the Ga face is impossible, while wet-etching the N face is possible has been noted. The N face (back side) can be rid of a damaged layer by either wet etching or dry etching. For the front side, removal is only by means of dry etching.

5. Study of Front-Side Dry Etching

Inasmuch as wet etching is ineffectual, the only option for etching the front side (Ga face) is by dry etching. Provided that dry etching is feasible, by that means removing a damaged layer along the front side of a GaN substrate ought to be possible.

Performing dry etching of GaN under the following conditions makes it possible to etch the front side.

| | |
|---|---|
| Equipment: | reactive ion etcher |
| Gas: | halogen gas (chlorine gas) |
| Chlorine flow rate: | 5 sccm to 100 sccm |
| Pressure during etch: | 0.1 Pa to 10 Pa |
| Plasma power: | antenna - 100 W to 500 W |
| | bias - 5 W to 20 W |

Figure 4:
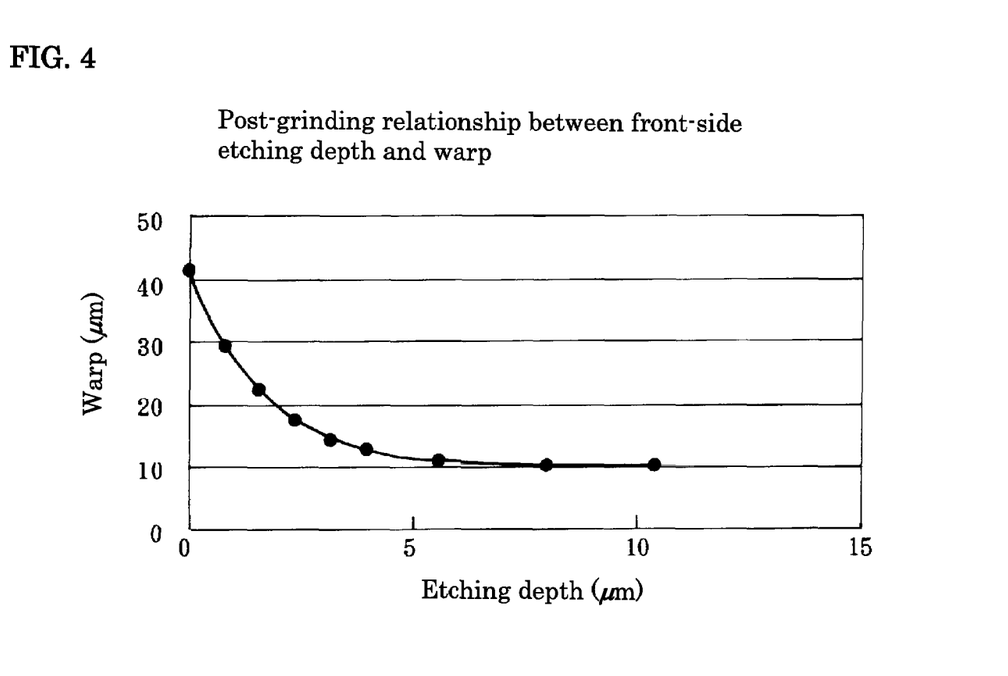

Plotted in FIG. 4 is the relationship between front-side etching depth and warp when the front side (Ga face) of a GaN substrate was dry-etched at: chlorine flow rate=10 sccm; pressure=1 Pa; antenna power 300 W; bias 10 W. The horizontal axis is the etching depth (μm); the vertical axis is the warp (μm). Although the warp was initially 40 μm, the etching carried out proceeded to curtail the warp: When the etching depth was 0.8 μm, the warp had decreased to +30 μm; at 1.3 μm etching depth the warp had decreased to +22 μm; at 2 μm etching depth, the warp had subsided to +16 μm; at 3.6 μm etching depth, the warp had subsided to +13 μm; at 5.5 μm etching depth, the warp had curtailed to +10 μm; and when the etching depth had gone to over 6 μm, the warp no longer subsided, staying at the +10 μm level.

It was realized that although with the front side being the Ga face, the front side could not be etched by wet etching techniques, with a dry etching technique—reactive ion etching (RIE)—the Ga face too could be etched. Then it was also realized that by means of the etching, positive warp (convexity in the front side) decreases. This was a crucial discovery. With the damaged layer being on the front side, the layer brought about positive warp (convexity along the front side). Since what gave rise to the positive warp was curtailed because the front side was reduced, the warp proceeded to decrease. Such is the plausible interpretation.

6. Study of Back-Side Dry Etching

Under the same conditions as with the front side, dry etching was possible on the back side (N face) of a GaN substrate. By means of dry etching using chlorine plasma, removal of a damaged layer from the back side was also possible. Removing the damaged layer from the back side altered the warp from being concave with respect to the front side to being convex with respect to the front side. (The warp changed heading from negative-ward to positive-ward.) And removing the damaged layer on the substrate back side was possible without spoiling the surface smoothness of the back side.

7. Controlling Warp

Herein it will become clear that warp can be controlled by combining grinding or a like mechanical process, and dry etching. A damaged layer forms when either the front side (Ga face) or the back side (N face) is ground. The damaged layer produces compressive force on the ground face, tending to stretch it. The front side therefore deflects convexly when a damaged layer is made on the front side. And the back side deflects convexly when a damaged layer is made on both sides. The warp rate can be modulated by the thickness d of the damaged layer, and the damaged layer can be removed by dry etching. If thus the thickness of the damaged layer is decreased, the warp will change from being convex to being concave. These are the reasons why warp can be controlled by the formation of a damaged layer.

Figure 5A:
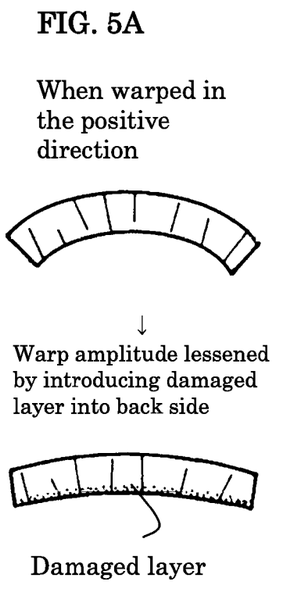
FIG. 5A illustrates a technique for a situation in which a post-growth substrate crystal is convexly buckled along the front side (H>0), in which grinding the back side creates a damaged layer on the back side, extending the back side and reducing the warp.
Figure 5B:
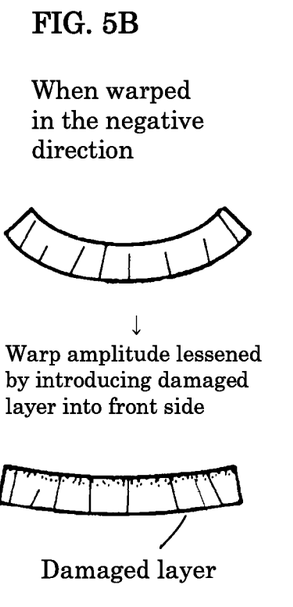
FIG. 5B illustrates a technique for a situation in which a post-growth substrate crystal is concavely buckled along the front side (H<0), in which grinding the front side introduces a damaged layer on the front side, extending the front side and reducing the warp.
Figure 5C:
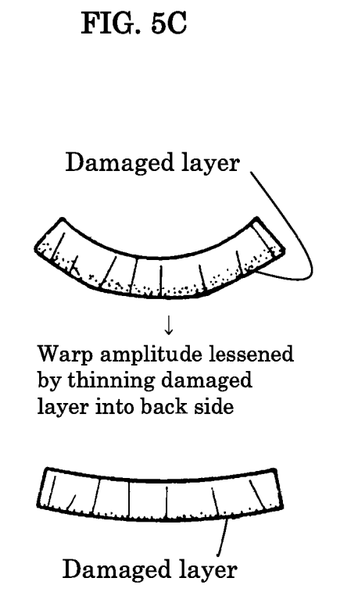
FIG. 5C illustrates a technique for a situation in which grinding the back side has produced a damaged layer to excess, resulting in concave warp along the front side, in which the damaged layer on the back side is removed by etching, which thins down the damaged layer to reduce the warp.

Such instances are illustrated in FIG. 5. The plural vertical lines drawn within the wafers represent dislocations. Further, fine stipples are drawn by the front/back side of the wafers; these are the damaged layer produced by grinding. FIG. 5A illustrates a technique for a wafer whose front side is convex (H>0), in which grinding the concave back side creates a damaged layer on the back side to curtail the warp. FIG. 5B illustrates a technique for a wafer whose front side is concave (H<0), in which grinding the concave front side forms a damaged layer on the front side to curtail the warp. FIG. 5C illustrates a technique of back-side dry-etching in which the back side of a wafer whose front side is concave (H<0) is ground to create on the back side a damaged layer, and the damaged layer on the back side is reduced and thinned down.

The warp in a GaN substrate deposited by a vapor-phase deposition onto a heterosubstrate, from which the base substrate is removed, is ±40 to as much as ±100 μm. If thus the warp is large, the error in the optical exposure pattern during device fabrication by photolithography will be too great. When contact exposing a substrate it is pressed upon, and if there is warp, the substrate can crack. Therefore, warp in the GaN substrate has to be +30 μm to −20 μm. More desirably, the warp is +20 μm to −10 μm, and optimally it is +10 μm to −5 μm.

GaN substrates are transparent. Forming thin films onto the GaN wafers by metalorganic chemical vapor deposition (MOCVD) or molecular-beam epitaxy (MBE), or vapor-depositing electrodes on the wafers means that they are placed on a susceptor with a built-in heater and heated; but because the wafers are transparent, they do not sufficiently absorb the radiant heat from the heater. Rather than the radiant heat, a wafer absorbs heat from the susceptor due to thermal conduction. Because the absorption route is by thermal conduction, it is vulnerable to how the wafer and susceptor are in contact. To make the heating uniform, the state of contact between the wafer and susceptor must be made uniform. If there is warp in the wafer, thermal conduction will be restricted to the central portion (concave warp) or to the peripheral portion (convex warp). With uniform heating being impossible on account of such warp, a strong, diametrically oriented temperature distribution is set up in the wafer. Consequently, the characteristics of the fabricated devices end up being inconsistent. In this respect GaN substrates differ vastly from Si and GaAs substrates.

Thus, as far as warp is concerned, more severe conditions are imposed on GaN substrates than on Si or GaAs substrates. Since in order to make thermal conduction uniform, globally even contact with the susceptor is sought, zero warp is ideal. The spread in which warp is tolerated is not identical above and below zero: a tolerance range in which above, where warp is convex, is up to 30 μm, and below, where warp is concave, is as far as 20 μm.

Thus the ranges of warp that can be tolerated are

Range (a): +30 μm to −20 μm;
Range (b): +20 μm to −10 μm; and
Range (c): +10 μm to −5 μm.

| Equipment: | reactive ion etcher |
| --- | --- |
| Gas: | halogen gas (chlorine gas) |
| Chlorine flow rate: | 5 sccm to 100 sccm |
| Pressure during etch: | 0.1 Pa to 10 Pa |
| Plasma power: | antenna - 100 W to 500 W |
| | bias - 5 W to 20 W |

Advantageous Features of the Invention

If with warp being large semiconductor devices are fabricated by photolithography onto GaN crystal wafer obtained by using vapor-phase deposition to grow GaN onto a heterosubstrate and stripping off the heterosubstrate, error in the transfer pattern will be significant. And there will be instances of cracking in the wafer when it is vacuum-chucked.

Inasmuch as the present invention brings the wafer warp to within +30 μm to −20 μm, even vacuum-chucked the wafer will not crack. Wafers according to the present invention do not fracture even when masks for contact exposure are set onto the wafers. Since there is no warp, the mask pattern is accurately transferred onto the resist, and errors do not appear in the optical exposure pattern. These features improve device-fabrication yields.

Inasmuch as a damaged layer is exploited to eliminate warp, the damaged layer of the present invention remains behind to some extent. A maximum of 50 µm of the damaged layer along the back side, and a maximum of 10 µm of the layer along the front side will in some cases be present. The damaged layer along the front side is so thin as not to be a hindrance when fabricating devices. Even along the back side, since the damaged layer is 50 µm or less, disruptions, such as growth of cracks or incidents of fracturing, following from wafer-processing based operations do not arise.

What the present inventors discovered is that grinding a nitride substrate surface with grit having a coarse mesh produces a damaged layer and the damaged layer has a stretching effect on the surface, and that by means of etching to diminish the damaged layer this action that tends to stretch the surface is curtailed. Accordingly, a novel technique by the present invention is the production of a planar substrate with minimal warp by introducing a (grinding) damaged layer onto the front side/back side of a nitride substrate, and removing the layer in part.

When the warp H is taken into consideration including its sign, front-side damaged layer introduction S and back-side etching T increase the warp H, while front-side etching U and back-side damaged layer introduction W decrease the warp H. This means:

| H Graduated Increase Processes - | front-side damaged layer introduction S, back-side etching T; |
|---|---|
| H Graduated Decrease Processes - | front-side etching U, back-side process-transformed layer introduction W. |

With front-side damaged layer introduction S and front-side etching U being stand-alone processes they do not necessarily have to form a pair. Likewise, with back-side etching T and back-side damaged layer introduction W being stand-alone processes they do not necessarily have to form a pair. But because the etching process has to be for removing a damaged layer, front-side damaged layer introduction S has to go ahead of front-side etching U. Likewise, back-side damaged layer introduction W has to precede back-side etching T.

Going a step further, the sign of these processes is taken to express increase/decrease in warp. Thus, S and T take positive values; U and W take negative values. Since the absolute value of the change in warp due to etching is smaller than that of change in warp due to a damaged layer, S+T is positive; U+W is negative. That is:

$$S>0;\ T>0 \tag{1}$$

$$U<0;\ W<0 \tag{2}$$

$$S+U>0 \tag{3}$$

$$W+T<0 \tag{4}$$

Letting the initial warp be $H_i$ and the final warp be $H_o$, then fundamentally $$H_i+S+U+W+T=H_o \tag{5}$$

Ideally the final warp $H_o$ is 0, but there is an optimal range about 0, and it is satisfactory to have the range be $$+30\ \mu m \geq H_o \geq -20\ \mu m \tag{6}$$

Given the significance of Equation (5), what this means is that increasing the warp through front-side grinding (since S is positive), decreasing the warp by front-side grinding (since U is negative), decreasing the warp by back-side grinding (since W is negative), and increasing the warp by back-side grinding (since T is positive) produces an appropriate (from −20 µm to +30 µm) final warp $H_o$. For the sake of simplicity, the final warp $H_o$ may be conceived of as being 0. Given the parameters in Equations (1) through (4), no matter what the initial warp $H_i$, it should be possible to bring the final warp to 0, or else to within the appropriate range (6).

Nevertheless, the fact that the final thickness of the damaged layer along the front side is 10 µm or less imposes a restriction on S+U (positive value). In turn, the fact that the thickness of the damaged layer along the back side is 50 µm or less imposes a restriction on W+T (negative value).

Because on W+T can be a negative number whose absolute value is considerably large, implementations in which the initial warp $H_i$ is positive mean for the present invention that with the degree of freedom being especially large, the invention is more easily embodied.

When the initial warp $H_i$ is positive—i.e., when there is a convexity along the front side (Ga face)—then steps S and U can be omitted, and the warp can be curtailed simply according to $$(H_i>0)\ H_i+W+T=H_o \tag{7}$$

In other words, this means that back-side grinding W and back-side etching T alone are sufficient. Moreover, if it is the case that change in warp can be accurately controlled by back-side grinding, then the back-side etching T may be omitted. That is, such cases make it that $$(H_i>0)\ H_i+W=H_o \tag{8}$$

This maintains that warp can be eliminated by back-side grinding W alone (Embodiment 3).

In instances in which the initial warp $H_i$ is negative—i.e., when there is a concavity along the front side (Ga face)—then since H has to be increased, S and T (S, T both positive) are required. But given this, because T necessarily entails W, what can be omitted is only front-side etching U. Then what is possible in such instances is $$(H_i<0)\ H_i+S+W+T=H_o \tag{9}$$

This states that warp can be curtailed by means of front-side grinding S, back-side grinding W, and back-side etching T alone (Embodiment 2).

Nonetheless, in some cases in which the initial warp $H_i$ is negative, using all four steps will be advisable:

$$(H_i<0)\ H_i+S+U+W+T=H_o \tag{10}$$

This states that warp can be curtailed by means of front-side grinding S, front-side etching U, back-side grinding W, and back-side etching T alone (Embodiment 1).

Techniques (9) and (10) can be utilized even when the initial warp $H_i$ is positive. Accordingly, noting down altogether techniques possible by the present invention would be as follows.

$$(H_i>0)\ H_i+W=H_o \tag{8}$$

$$(H_i>0)\ H_i+W+T=H_o \tag{7}$$

$$(H_i\ pos./neg.)\ H_i+S+W+T=H_o \tag{9}$$

$$(H_i\ pos./neg.)\ H_i+S+U+W+T=H_o \tag{10}$$

EMBODIMENTS

GaN was grown by HVPE onto a GaAs base substrate as described earlier. The GaAs base substrate was removed to render freestanding, independent GaN crystals. The as-grown GaN crystal substrates thus obtained were 50.8 mm in diameter (2-inch) and 500 µm in thickness.

The substrates had a concavity along the front side (Ga face), with the absolute value of the warp being 40 µm or more (H<−40 µm). The surface roughness of the front side was $R_{max}$ 10 µm or more. The surface roughness and warp were measured employing a stylus surface profilometer ("Surfcom," manufactured by Tokyo Seimitsu Co.).

The GaN crystals were affixed by means of wax to a platen made of alumina ceramic, and were then ground under the conditions tabulated below.

TABLE I

| GaN crystal substrate front-/back-side grinding conditions | |
| --- | --- |
| GaN Crystal | Outer diameter: 2-inch (50.8 mm φ); Thickness: 500 µm |
| Grinding surface | (0001) plane; Ga face or else N face |
| Grinding device | Rotary-type grinder |
| Grinding parameters | Grit dia.: 200 mm φ |
| | Grit/grain size: Diamond, #325 |
| | Working revs: 400 rpm |
| | Feed rate: 5 µm/min. |
| | Grinding slurry supply rate: 5 L/min. |

The planarity (warp) of the GaN crystal substrate still affixed to the polishing platen immediately after grinding was ±2 µm, and the surface roughness $R_{max}$ was 0.5 µm. Because the polishing platen is perfectly flat, it stands to reason that warp in a substrate bound fast to the platen will be slight.

The polishing platen was heated to 100° C. to peel the GaN crystal substrate off the platen.

The GaN crystal substrate broken away from the polishing platen was ultrasonically cleansed in isopropyl alcohol. Warp in the GaN substrate in respective stages was then measured.

Grinding as just described was carried out on both the front side (Ga face) and back side (N face).

The grinding produced damaged layers. Arrangements were made to etch the substrate so as to remove the damaged layer at once following grinding. Although the N face (back side) could be wet-etched using KOH, on the Ga face (front side), inasmuch as wet etching is ineffectual, dry etching using a chlorine plasma was performed. Of course, dry etching the back side also is possible. The etching conditions were:

TABLE II

| Dry etching parameters | |
| --- | --- |
| Equipment | Reactive ion etcher |
| Gas | Chlorine |
| Chlorine flow rate | 10 sccm |
| Pressure during etch | 1 Pa |
| Plasma power | Antenna: 300 W; Bias: 10 W |

Either the front side or the back side may be ground first. For Procedure A and Procedure B below, the respective sequences are indicated. It is not necessary to set the procedure so that an etching operation always follows on a grinding operation; both substrate sides may be ground, following which both sides may then be etched (Procedure C and Procedure D).

Inasmuch as cleaning and drying are performed following the respective stages, such as when the substrate is broken away from the polishing platen, and after etching, herein they have been omitted.

Procedure A
Front-side grinding
Front-side dry etch (chlorine plasma)
Back-side grinding
Back-side wet etch (KOH), or dry etch (chlorine plasma)

The procedural order written out in slightly more detail would be as follows.

Grow substrate→Affix to platen→Grind front side→Break away from (lift off of) platen→Dry-etch front side→Affix to platen→Grind back side→Break away from (lift off of) platen→Wet-etch or dry-etch back side.

Procedure B
Back-side grinding
Back-side wet etch (KOH), or dry etch (chlorine plasma)
Front-side grinding
Front-side dry etch (chlorine plasma)

The procedural order written out in slightly more detail would be as follows.

Grow substrate→Affix to platen→Grind back side→Break away from (lift off of) platen→Wet-etch or dry-etch back side→Affix to platen→Grind front side→Break away from (lift off of) platen→Dry-etch front side.

Procedure C
Front-side grinding
Back-side grinding
Front-side dry etch (chlorine plasma)
Back-side wet etch (KOH), or dry etch (chlorine plasma)

Procedure D
Back-side grinding
Front-side grinding
Back-side wet etch (KOH), or dry etch (chlorine plasma)
Front-side dry etch (chlorine plasma)

In Embodiment 1 set forth below, Procedure A is adopted, with the substrate warp being measured in the post-grown free state, in the post-grinding bound state as adhered to the platen, in the free state after being broken away from the platen, in the free state following front-side etching, in the bound state as adhered to the platen following back-side grinding, and in the free state following back-side.

Embodiment 1

Concave warp (H<0): Front-side grinding→Front-side DE→Back-side grinding→Back-side DE The warp in the free state of a (2-inch φ, 500-µm thickness) GaN crystal from which the GaAs base substrate had been removed was H=−50 µm (front-side concavity). The back side was affixed to the polishing platen and the front side was ground. The grinding conditions were as described earlier. The absolute value of the post-grinding front-side warp in the GaN crystal as affixed in the bound state was no more than 1 µm. The warp in the GaN crystal in the free state as having been lifted off the platen was H=+30 µm.

This means that along the front side the crystal had gone convex. The reason for this is because a thick damaged layer had been introduced into the front side by the grinding, and the damaged layer generated stress that tended to stretch the front side. Because the presence of a damaged layer on the front side is not acceptable, the front side was given a dry etch (DE) with a chlorine plasma. Thereafter the warp proved to be H=+10 µm. Although the condition of convexity along the front side did not itself change, the amount of warp was reduced. In addition, the front side was affixed to the platen and the back side was ground. The grinding conditions were as described earlier. The post-grinding back-side warp in the GaN crystal as adhered fast to the platen was no more than 1 μm.

The warp in the GaN crystal in the free state as having been undone from the platen was −20 μm. The reason for this is because a damaged layer had been produced along the back side by the grinding, and the damaged layer acted to stretch that surface. The warp in the free state after the back side next had been dry-etched was H=−5 μm. This means that the warp had for the most part disappeared. This warp sufficiently satisfies according to the present invention the condition: +30 μm≧H≧−20 μm; it satisfies the more preferable condition: +20 μm≧H≧−10 μm; and in fact it satisfies the optimal condition: +10 μm≧H≧−5 μm.

Grinding gives rise to a damaged layer and since the layer pressingly stretches the ground surface, the warp changes to the opposite side. And the further significance is that when the damaged layer is removed by etching, the warp is curtailed in correspondence with the amount removed. In sum, what this means is that by combining grinding and etching, the warp can be reduced or eliminated.

TABLE III

Embodiment 1 change in warp immediately after crystal growth, after front-side grinding, after lift-off, after front-side dry etch, after back-side grinding, after lift-off, and after back-side dry etch

| Stage | Warp H (μm) |
|---|---|
| Just after crystal-growth (free state) | −50 |
| After front-side grinding (bound state) | 0 |
| After lift-off (free state) | +30 |
| After front-side dry etch (free state) | +10 |
| After back-side grinding (bound state) | 0 |
| After lift-off (free state) | −20 |
| After back-side dry etch (free state) | −5 |

Embodiment 2

Concave Warp (H<0): Front-side Grinding→Back-side Grinding→Back-side DE

Embodiment 2 is one in which the front-side dry etch (DE) of Embodiment 1 was omitted.

The warp in the free state of a (2-inch φ, 500-μm thickness) GaN crystal from which the GaAs base substrate had been removed was H=−50 μm (front-side concavity). The back side was affixed to the polishing platen and the front side was ground. The grinding conditions were as described earlier. The absolute value of the post-grinding front-side warp in the GaN crystal as affixed in the bound state was no more than 1 μm. The warp in the GaN crystal in the free state as having been lifted off the platen was H=+30 μm.

This means that along the front side the crystal had gone convex. The reason for this is because a thick damaged layer had been introduced into the front side by the grinding, and the damaged layer generated stress that tended to stretch the front side. No dry etch was performed on the front side, but the front side was affixed to the platen and the back side was ground. The grinding conditions were as described earlier. In the back-side grinding there were instance in which local cracking occurred. The post-grinding back-side warp in the GaN crystal as adhered fast to the platen was no more than 1 μm.

The warp in the GaN crystal in the free state as having been undone from the platen was −30 μm. The reason for this is because a damaged layer had been produced along the back side by the grinding, and the damaged layer acted to stretch that surface. The back side was next dry-etched. Thereafter the warp in the free state was H=−20 μm. This warp satisfies according to the present invention the condition: +30 μm≧H≧−20 μm. This is a warp range within which photolithography is possible. Of particular significance here is that because front-side etching was not carried out, a factor that makes H positive was diminished.

TABLE IV

Embodiment 2 change in warp immediately after crystal growth, after front-side grinding, after lift-off, after back-side grinding, after lift-off, and after back-side dry etch

| Stage | Warp H (μm) |
|---|---|
| Just after crystal-growth (free state) | −50 |
| After front-side grinding (bound state) | 0 |
| After lift-off (free state) | +30 |
| After front-side dry etch (free state) | — |
| After back-side grinding (bound state) | 0 |
| After lift-off (free state) | −30 |
| After back-side dry etch (free state) | −20 |

Embodiment 3

Convex Warp (H>0): Back-side Grinding

The warp in the free state of a (2-inch φ, 500-μm thickness) GaN crystal from which the GaAs base substrate had been removed was H=+30 μm (front-side convexity). The crystal was affixed to a ceramic platen, and both sides were ground so as to lessen the damaged layer. That meant a fine-mesh grit was employed. The Ra was not more than 5 nm.

In this embodiment, warp could be eliminated without creating a front-side-ground damaged layer and without etching, which was simpler. The front side was affixed to the polishing platen and the back side was ground. The grinding conditions were as described earlier. The post-grinding back-side warp in the GaN crystal as adhered fast to the platen was no more than 1 μm. The warp in the GaN crystal in the free state as having been lifted off the platen was +10 μm. Because the warp was "+," back-side etching was not performed. Significant in this embodiment—an instance in which the warp was convex—is that the warp could be curtailed simply by introducing a damaged layer into the back side.

TABLE V

Embodiment 3 change in warp immediately after crystal growth, after back-side grinding, and after lift-off

| Stage | Warp H (μm) |
|---|---|
| Just after crystal-growth (free state) | +30 |
| After front-side grinding (bound state) | — |
| After lift-off (free state) | — |
| After front-side dry etch (free state) | — |
| After back-side grinding (bound state) | 0 |
| After lift-off (free state) | +10 |
| After back-side dry etch (free state) | — |

Herein, should the warp be negative after the back side is ground (convexity along back side), etching the back side to take away part of the damaged layer will bring the surface closer to planar (H→0).

Only selected embodiments have been chosen to illustrate the present invention. To those skilled in the art, however, it will be apparent from the foregoing disclosure that various changes and modifications can be made herein without departing from the scope of the invention as defined in the appended claims. Furthermore, the foregoing description of the embodiments according to the present invention is provided for illustration only, and not for limiting the invention as defined by the appended claims and their equivalents.

What is claimed is:

1. For a gallium nitride semiconductor substrate having a 0001 gallium face terminated with gallium atoms, a method of dry-etching the gallium face for reducing wrapage of the substrate, comprising:
   (a) deploying the gallium nitride semiconductor substrate in a reactive-ion etching chamber to dispose the gallium face for being dry etched in the chamber;
   (b) introducing a chlorine gas into the chamber; and
   (c) applying an antenna power and a bias power to the substrate, the antenna power and the bias power operative to form a chlorine plasma and thereby dry etch the gallium face.

2. The gallium nitride substrate dry-etching method of claim 1, wherein the chlorine gas is introduced into the chamber at a flow rate in the range from 5 to 100 sccm, and to a pressure in the range from 0.1 to 10 Pa.

3. The gallium nitride substrate dry-etching method of claim 1, wherein:
   the antenna power is in the range from 100 to 500 W; and
   the bias power is in the range from 5 to 20 W.

4. The gallium nitride substrate dry-etching method of claim 1, achieving an etching depth of at least 5 μm.

5. For a gallium nitride semiconductor substrate having a 0001 gallium face terminated with gallium atoms, a method of dry-etching the gallium face for reducing wrapage of the substrate, comprising:
   (a) mechanically abrading the gallium face of the gallium nitride semiconductor substrate to produce a damage layer;
   (b) deploying the gallium nitride semiconductor substrate in a reactive-ion etching chamber to dispose damage layer for being dry etched in the chamber;
   (c) introducing a chlorine gas into the chamber; and
   (d) applying an antenna power and a bias power to the substrate, the antenna power and the bias power operative to form a chlorine plasma and thereby dry etch the damage layer.

6. The gallium nitride substrate dry-etching method of claim 5, wherein the chlorine gas is introduced into the chamber at a flow rate in the range from 5 to 100 sccm, and to a pressure in the range from 0.1 to 10 Pa.

7. The gallium nitride substrate dry-etching method of claim 5, wherein:
   the antenna power is in the range from 100 to 500 W; and
   the bias power is in the range from 5 to 20 W.

8. The gallium nitride substrate dry-etching method of claim 5, achieving an etching depth of at least 5 μm.

* * * * *